United States Patent
Bushida et al.

[11] Patent Number: 6,154,028
[45] Date of Patent: Nov. 28, 2000

[54] MINIATURE MAGNETIC SENSOR DEVICE USING AN INDUCTOR DEVICE

[75] Inventors: Kenichi Bushida; Shuji Ueno; Shinji Furukawa, all of Kyoto; Isamu Ogasawara, Shiga, all of Japan

[73] Assignee: Unitika Ltd., Hyogo, Japan

[21] Appl. No.: 09/192,334

[22] Filed: Nov. 16, 1998

[30] Foreign Application Priority Data

Nov. 17, 1997 [JP] Japan ................................. 9-314981
Feb. 20, 1998 [JP] Japan ................................. 10-038914

[51] Int. Cl.$^7$ ................... G01R 33/04; G01K 33/02; H01F 17/04
[52] U.S. Cl. ................... 324/253; 324/258; 336/221; 336/96
[58] Field of Search ................... 324/253, 225, 324/258, 256, 257, 234, 235, 237, 207.15, 207.12; 336/96, 174, 205, 233, 221

[56] References Cited

U.S. PATENT DOCUMENTS 4,739,263 4/1988 Morhri et al. ................... 324/247

Primary Examiner—Gerard Strecker
Assistant Examiner—Anthony Jolly
Attorney, Agent, or Firm—Sughrue, Mion, Zinn, Macpeak & Seas, PLLC

[57] ABSTRACT

A magnetic sensor device comprising a magnetic element and a wire wound around the magnetic element. The magnetic element has a cross-sectional area of not more than 0.55 mm$^2$ and a saturation magnetostriction constant $\lambda s$ whose absolute value is smaller than $1 \times 10^{-6}$, with Sw/Sm being equal to or smaller than 9, provided that Sw is the cross-sectional area of the wire and Sm is the cross-sectional area of the magnetic element. Preferably, the magnetic element has an elastic limit $\sigma m$ greater than 1,000 MPa, and the elongation the magnetic element experiences upon application of a stress equal to the elastic limit $\sigma m$ is between 1.0% and 5.0%. It is also preferable that the magnetic element and the wire are covered with a resin layer to form an integral unit.

5 Claims, 5 Drawing Sheets

MINIATURE MAGNETIC SENSOR DEVICE USING AN INDUCTOR DEVICE

BACKGROUND OF THE INVENTION

1. Field of the Invention

This invention relates to a magnetic sensor device that uses an inductor device.

2. Description of the Related Art

Magnetic sensors employ various kinds of sensor devices, one of which makes use of an inductor device. The inductor device is basically composed of a magnetic element serving as a core, and a copper wire wound around the magnetic element. The inductor device is typically used as one of a number of passive elements that compose an electronic circuit. A signal due to the inductance component of a magnetic element varies upon application of an external magnetic field (Hex). Magnetic sensor devices making use of this phenomenon are currently employed in many diverse fields. Basically, a copper wire wound in a coil form provides a passive element having an inductance. By inserting a magnetic element into the coil, the coil's inductance L can theoretically be increased in a way that is dependent on the permeability of the magnetic element as expressed by the following Equation (1):

$$L = \pi a^2 \mu n^2 l \quad (1)$$

where a is the radius of the magnetic element; l is the length of the coil; n is the number of turns of the coil; and $\mu$ is the permeability of the magnetic element. By using a core (i.e., magnetic element) having a greater permeability than a hollow core, the inductance of the inductor device can be increased. It is also possible to increase the voltage that develops across the coil when the inductor device is excited by application of an alternating current. In a particular case where the inductor device is used as a magnetic sensor device, the sensitivity for detecting a magnetic field and, hence, the signal to noise ratio (S/N ratio), can be increased.

An example of the magnetic sensors that employ the inductor device described above is a flux gate (FG) sensor. Compared with other magnetic sensors, such as a Hall effect sensor, a magnetic resistance (MR) effect sensor and a giant magnetoresistance (GMR) effect sensor, the FG sensor device of current models exhibits a very high sensitivity for detecting magnetic fields. On the pages that follow, the operation of the FG sensor device is described with reference to its typical configuration, together with the current status of the magnetic sensors.

A magnetic sensor device for use in the FG sensor is generally composed of a high-permeability magnetic core made of a magnetic material and one or more coils wound around the magnetic core. Two coils are typically used, one being an exciting coil and the other being a detecting coil. Assume here that a sinusoidal alternating current having a sufficient amplitude to magnetically saturate the core is applied to the exciting coil around the core. In the absence of an external magnetic field, the BH characteristic of the core, which is symmetrical with respect to the origin, allows the detecting coil to develop a voltage waveform containing only higher harmonics of xth orders (x being an odd number). If an external magnetic field is applied, the BH characteristic of the core becomes asymmetrical with respect to the origin, and the voltage induced in the detecting coil will contain not only higher harmonics of xth orders (x being an odd number) but also those of mth orders (m being an even number). Since the amplitude of these harmonics is proportional to the change in the applied external magnetic field, the magnetic sensor is highly sensitive to detecting the change in that amplitude.

As just described above, the FG sensor in common use takes advantage of the magnetic saturation characteristic of a high-permeability core. While the inductor device is basically composed of a magnetic element serving as a core and a copper wire wound around the magnetic element, the methods of excitation and detection are by no means limited to those described above.

In another example, both ends of the coil are excited by application of an alternating current, and the phase of the voltage generated across the coil is detected, thus providing a magnetic sensor that operates on the basic principle of the flux gate sensor. In yet another example, both ends of the coil are excited by application of an alternating current such as to produce a sufficient magnetic field to magnetically saturate the core. The amplitude change in the inductance of the voltage generated across the coil due to the applied external magnetic field is detected, thus providing a magnetic sensor of high sensitivity. In short, the magnetic sensor device used in magnetic sensors employing various methods of detection typified by the method used by the FG sensor is basically composed of a core made of a magnetic material around which a wire such as a copper wire with an insulation coating is wound. Magnetic sensors employing detection methods typified by the method used by the FG sensor are used in many quantities in diverse fields because they are highly sensitive in detecting magnetic fields.

As already mentioned, the magnetic sensor device is basically composed of a magnetic element and a wire such as a copper wire that is wound around the magnetic element. Because of this great simplicity in structure, the magnetic sensor device has the advantage of suffering from only a few drawbacks. If the magnetic element in the magnetic sensor device has a large cross-sectional area, the wire such as a copper wire is directly wound around the element. If the magnetic element has a small cross-sectional area, the wire is wound onto a bobbin-shaped frame molded from resin, and the magnetic element is inserted into the frame.

Magnetic sensors are currently used in the electronics and information fields and in various industrial machines, so they are required to be compact and yet have high sensitivity. Magnetic sensor devices are applied as the sensing head of magnetic sensors that are employed in large quantities in information fields (e.g., computers) and instrumentation which recently has seen rapid technical advances. In particular, there exists a strong need for miniaturizing the magnetic sensor device that is the heart of magnetic sensors. However, the ferritic core, which is commonly used as a highly sensitive magnetic core in the FG sensor, is a sintered ceramic body and, hence, is vulnerable to impact. In addition, it is practically impossible to manufacture sintered bodies of small cross-sectional area, and no successful attempts have been made to miniaturize the magnetic sensor device.

Even if direct winding is practiced, the wire directly wound around the magnetic element exerts a greater than negligible stress on the element. Magnetic materials generally have such a property that their shape changes when they are magnetized by application of a magnetic field; this phenomenon is called "magnetostriction." The magnitude of magnetostriction is defined as $\delta l/l$ (saturation magnetostriction constant) where l is the length of the magnetic material and $\delta l$ is the saturated value of the change in length of the magnetic material due to the applied magnetic field. The sign of this saturation magnetostriction constant is positive if the length of the magnetic material increases in the direction in which the magnetic field is applied, and it is negative if the length decreases in the same direction.

Conversely, if a stress is applied to a magnetostrictive material, its magnetic characteristics will change. The practical implication of the effect of magnetostriction is that the greater the magnetostriction constant a given magnetic material has, the greater the change that occurs in its magnetic characteristics upon application of a stress. This is problematic in that a wire wound directly around the magnetic material will exert a winding stress on the magnetic material, causing fluctuations in its magnetic characteristics.

As a further difficulty, even if direct winding causes a constant stress to be applied to the magnetic material per unit area, a large amount of force will act on the magnetic material if the material has a very small cross-sectional area. The stress of the direct winding may potentially affect the magnetic material in its entirety. For these reasons, direct winding is not currently applied to magnetic materials having a very small cross-sectional area.

The inability to reduce the cross-sectional area of the magnetic element, which is used as a magnetic core, has been a great obstacle to miniaturizing the magnetic sensor device that uses the magnetic element. More specifically, in the FG sensor device and other magnetic sensor devices of a similar type that excite the magnetic material by means of a coil wound around the material and that use the resulting change in the material's magnetic characteristics to detect an externally applied magnetic field, the ratio (l/S) of the length l of the magnetic material in the direction of its excitation with the coil to its cross-sectional area S (l/S) is critical. The value of l/S determines whether a highly sensitive magnetic sensor device can be fabricated. If the ratio of the length l of the magnetic material to its cross-sectional area S is unduly small, a great demagnetizing field Hd develops, making it impossible to achieve effective excitation of the magnetic material. Hence, in order to ensure that a magnetic element working as a core having a coil wound circumferentially therearound is effectively excited, the demagnetizing field coefficient Nd has to be reduced.

The magnitude of a demagnetizing field coefficient Hd is proportional to the strength of the magnetic poles and can be expressed by:

$$Hd = -NdI/\mu O \quad (2)$$

where $\mu O$ is the permeability in a vacuum and I is magnetization. According to Equation (2), the smaller the demagnetizing field coefficient Nd, the greater the effectiveness with which the magnetic material serving as a core can be excited. It should also be noted that the value of the demagnetizing field coefficient Nd varies with the shape of the magnetic material to be magnetized. Suppose here that a magnetic element having a longer-to-shorter axis ratio of 100 is magnetized in the direction of its longer axis. If the magnetic element is rod-shaped, it has a demagnetizing field coefficient Nd of 0.00036. If the magnetic element is a prolate ellipsoid of revolution (i.e., cigar-shaped), Nd is 0.00043. In the case of a flattened ellipsoid of revolution (i.e., disk-shaped), the value of Nd is 0.00776. FIG. 1 shows in experimental values the relationship between the demagnetizing field coefficient Nd and the ratio of the longer axis of a rod-shaped magnetic element to its shorter axis. Magnetic sensor devices in current commercial grades of FG sensors are generally at least 20 mm long. However, the need for smaller dimensions, particularly in length, has recently become one of the strong requirements in the field of electronic components. A maximum length that is tolerated for one magnetic sensor device is about 10 mm.

Suppose here that a wire is directly wound around a magnetic core having a length of 10 mm. If the demagnetizing field coefficient Nd is limited to not more than 1% (0.01) in order to achieve effective excitation of the magnetic core, one can see from FIG. 1 that the ratio of the longer axis of the magnetic-core to its shorter axis is about 12. Therefore, the cross-sectional area of the magnetic core must be 0.55 mm² and smaller.

For the reasons stated above associated with the strength of the magnetic material and its magnetostrictive property, it has heretofore been necessary to use a magnetic material of small cross-sectional area in combination with a bobbin-like frame separately molded from a resin as a winding support. With this frame, a sensor device can be fabricated without considering the strength of the magnetic material and the magnitude of the magnetostrictive property it experiences. However, this frame does not satisfy the primary objective of miniaturizing magnetic sensor devices.

An object, therefore, of the present invention is to provide a compact magnetic sensor device using an inductance device.

SUMMARY OF THE INVENTION

It is an object of the present invention to provide a compact magnetic sensor device using an inductance device.

As mentioned above, in order to miniaturize a magnetic sensor device by reducing its length, it is also necessary to reduce the cross-sectional area of the magnetic core. However, in order to reduce the cross-sectional area of the magnetic core, the magnetic material serving as the core must experience only a small degree of magnetostriction. Preferably, the magnetic core must have a sufficient mechanical strength to withstand direct winding of a wire. Under these circumstances, the present inventors conducted intensive studies with a view toward producing a magnetic sensor device that is reduced in scale and satisfies the above requirements. That is, the inventors applied a direct winding to a magnetic material that has a small cross-sectional area, yet suffers from a minimal adverse effect of the direct winding on the magnetic material. As the result, the inventors found that the adverse effects of direct winding on the characteristics of a magnetic material can be reduced if its magnetostriction constant is appropriately controlled.

The magnetic sensor device of the present invention comprises a magnetic element and a wire wound around the magnetic element. The magnetic element has a cross-sectional area of not more than 0.55 mm², and a saturation magnetostriction constant whose absolute value is smaller than $1 \times 10^{-6}$, with Sw/Sm being equal to or smaller than 9 provided that Sw is the cross-sectional area of the wire and Sm is the cross-sectional area of the magnetic element. The "magnetic element" may be one coated with a resin or the like. In order to provide an even smaller magnetic sensor device, the magnetic element desirably has a cross-sectional area of not more than 0.25 mm². If the cross-sectional area of the magnetic element exceeds 0.55 mm², a small device not longer than 10 mm will be affected by the demagnetizing field from the magnetic core, and cannot have high sensitivity. Preferably, the elastic limit, σm, of the magnetic element is greater than 1,000 MPa. It is also preferable that the elongation ε the magnetic element undergoes when an applied stress equal to σm is between 1.0% and 5.0% (i.e., 1.0%<ε<5.0%). The magnetic element is preferably a wire, with an amorphous magnetic wire being particularly preferred.

In another preferred embodiment, the magnetic sensor device includes a resin layer that covers both the magnetic element and the wire, to thereby form an integral unit. This design improves the environmental resistance of the sensor device.

In a further preferred embodiment, the resin layer consists of an elastomeric first resin layer that covers the magnetic element and the wire, and a second resin layer that covers the first resin layer.

According to the present invention, there is provided a miniaturized magnetic sensor device. Hence, less energy is required to excite the magnetic sensor device. This greatly reduces the size of a magnetic sensor employing the magnetic sensor device and the power the device consumes.

In addition, the magnetostriction constant λs of the magnetic element to be used in the magnetic sensor device of the present invention is controlled. Furthermore, a suitable magnetic element is selected in terms of its elastic limit σm and its elongation ε due to an application of a stress equal to the elastic limit σm. A magnetic sensor device meeting these requirements has consistent performance, and suffers only a small effect from direct winding.

If the magnetic element and the wire wound around the magnetic element are made integral by being covered with a resin layer, there is provided a magnetic sensor device that is of a very simple construction and yet has high environmental resistance (i.e., exhibits consistent magnetic characteristics when used in a hostile environment). Therefore, one can easily realize a magnetic sensor device that has desired characteristics that are compatible with the specifications of various magnetic sensors that find utility in diverse fields. As a result, there is provided a magnetic sensor device having not only a very wide range of applicability, but also great diversity of use. For example, the magnetic sensor device of the present invention can advantageously be applied to terrestrial magnetism using a directional sensor for use in an automotive navigation system that is gaining rapidly increasing popularity among drivers.

The entire disclosure of each and every foreign patent application from which the benefit of foreign priority has been claimed in the present application is incorporated herein by reference, as if fully set forth.

DETAILED DESCRIPTION OF THE INVENTION

Figure 1:
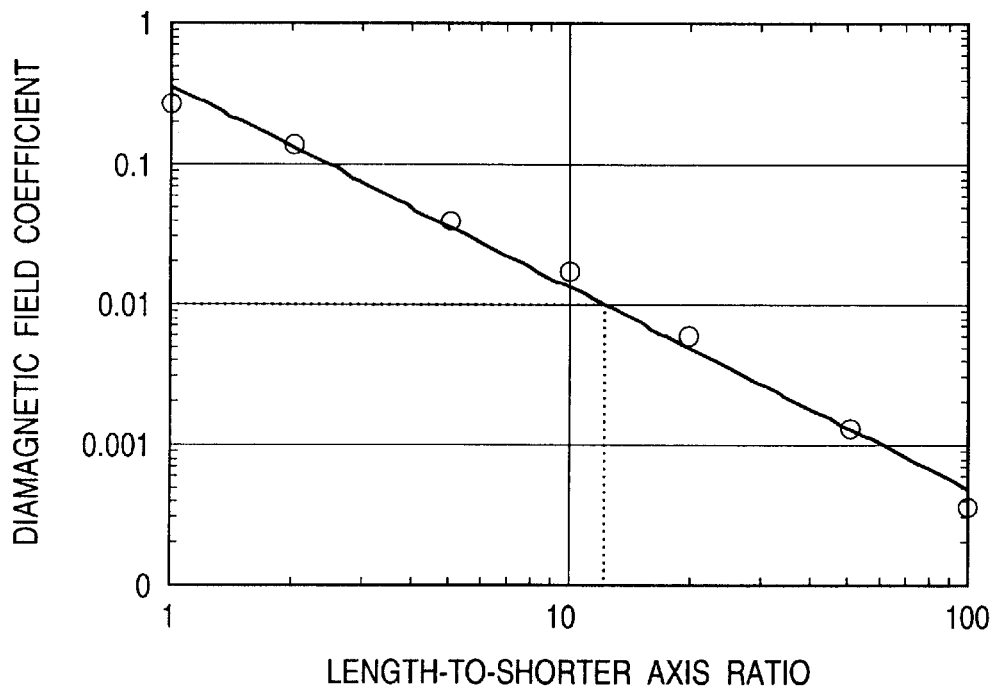
FIG. 1 is a graph showing the relationship between a shape of a magnetic element and its demagnetizing field coefficient.

Several embodiments of the present invention will now be described with reference to the accompanying drawings. The magnetic sensor device of the present invention is composed of a magnetic element and a wire. The wire is wound around the magnetic element, and forms a small coil which serves as an inductor device that is responsible for the basic characteristics of the magnetic sensor device.

It is generally known that the magnetostriction constant of a magnetic material varies greatly with its composition and that the magnetostriction constants of two magnetic materials having the same composition can be controlled by subjecting them to heat treatment. In light of this knowledge, the present inventors prepared a plurality of magnetic elements having different degrees of magnetostriction, directly wound a wire around each magnetic element and evaluated the effect of the direct winding in terms of the change in inductance. It was discovered that a magnetic sensor device that is not influenced by the stress from the direct winding can be fabricated by adjusting the absolute value of the saturation magnetostriction constant λs of the magnetic element to be less than $1 \times 10^{-6}$. Ideally, the value of λs should be as close to zero as possible. If $|\lambda s| < 1 \times 10^{-6}$, the effect of direct winding on the magnetic element can be reduced. Preferably, $|\lambda s|$ should be smaller than $0.1 \times 10^{-6}$ in order to minimize the effect on the inductance of the magnetic sensor device.

Also, in producing a magnetic sensor device that is not affected by the application of the stress from the direct winding of a wire, the strength of the magnetic element around which the wire is to be wound is critical. Generally, the strength of the magnetic element increases with its elastic limit, so the upper limit of the stress on the magnetic element that results from the direct winding can be expressed as the value of elastic limit that is obtained by measuring a tensile strength-elongation curve. The term "elastic limit" as used herein means the maximum stress a solid can sustain without undergoing permanent deformation (i.e., it can return to the initial state after removal of the applied stress). A pseudoelastic region that is unique to amorphous magnetic materials in also covered by the elastic limit. Thus, if the stress applied to the magnetic material by direct winding is not greater than the elastic limit, its inherent characteristics of the magnetic element can be restored by removing the winding tension during a posttreatment. However, when a winding stress that is greater than the elastic limit is applied to the magnetic material, the material undergoes plastic deformation. Once a magnetic material undergoes plastic deformation, removing winding stress after direct winding no longer results in the magnetic material returning to its initial characteristics.

The inventors of the present invention found that, in practice, direct winding can easily be accomplished if the elastic limit σm of the magnetic element serving as the magnetic core is greater than 1,000 MPa; this finding finally led to the achievement of the present invention. If direct winding is applied to a magnetic material whose σm is equal to or smaller than 1,000 MPa, the resultant winding stress will deform the magnetic material. As a result, the magnetic material's magnetic characteristics vary so much as to make it difficult to produce a magnetic sensor device having the desired inductance value. In an extreme case, the winding stress may be great enough to physically break the magnetic material, so that the magnetic material will no longer fully perform its intended function as a core. Most of the existing magnetic materials have an upper elastic limit σm of about 4,000 MPa, but the magnetic material to be used in the present invention preferably has the greatest possible elastic limit σm in excess of 1,000 MPa.

Further, the result of winding a wire directly around a magnetic material depends largely upon the elasticity of the magnetic material. A substance that extends well may generally be regarded as being soft. Thus, elasticity of the magnetic material can be evaluated by the degree of its extension upon application of a stress equal to the elastic limit as determined by the measurement of a tensile stress-elongation curve. In practice, direct winding can easily be accomplished without breaking the magnetic material when the elongation ε of the magnetic material upon application of a stress equal to σm is adjusted to lie between 1.0% and 5.0% (i.e., 1.0%<ε<5.0%). If the elongation upon application of σm is unduly small, even the slightest distortion that accompanies direct winding may cause plastic deformation of the magnetic material. It is impossible to fabricate a magnetic sensor device that reflects the characteristics of such a magnetic material. Additionally, such a magnetic material itself may be physically broken so as to no longer be fully capable of performing its function as a core. Upon application of a stress equal to σm, a minimal elongation ε of about 1% should occur. If the actual elongation is smaller than 1%, a slight distortion that is caused by the stress from direct winding will break the magnetic material. If elongation ε is greater than 5%, the magnetic material around which a wire is being directly wound will flex so much that is becomes difficult to achieve aligned winding (i.e., successive turns of a coil being aligned with each other).

A further advantage of adjusting the elongation ε to be in the range of 1.0%<ε<5.0% is that a magnetic sensor device meeting the requirements of the present invention can be easily produced. By setting the characteristic of the magnetic material to lie within the above-stated range, a magnetic sensor device that exhibits consistent performance can be provided at low cost, without requiring a resinous bobbin frame. In addition, the magnetic sensor device is so simple in construction that it has a very low failure rate and high reliability.

Another factor that was found by the inventors to be important in producing the magnetic sensor device of the present invention is the relationship between the cross-sectional area of the magnetic element serving as the core of the magnetic sensor device and that of the coil formed by the wire wound directly around the magnetic element. Consider, for example, the case of fabricating a small magnetic sensor device according to the present invention using a magnetic element (with a radius a) and a coil of wire, each having a circular cross section. If the coil of wire wound directly around the magnetic element has a larger cross-sectional area than the magnetic element, the radius of curvature R of the wound wire is equal to a on the inside of the wire that forms the innermost layer of the coil and that has direct contact with the magnetic element, and is greater than 3a on the outside of that wire. Thus, the radius of curvature of the coil of wire differs considerably between its inside and outside portions.

The coil of wire to be wound around the magnetic element is typically composed of an innermost portion, an insulation layer, and an optional fusing layer. The innermost portion is principally used to carry an excitation current. The insulation layer that surrounds the innermost portion prevents shorting from occurring, primarily between adjacent turns of the coil through which the current is carried. The optional fusing layer is heated, and coated with an organic solvent or otherwise treated after the winding operation in order to fix the coil in position. Given this layer arrangement, if the coil of wire to be directly wound around the magnetic element has a larger cross-sectional area than the magnetic element that serves as the core, the radius of curvature of the wire becomes small enough to induce rupture of the insulation layer. If the insulation layer breaks, the excitation current will not flow through the intended path, and shorting will occur between adjacent turns of the coil. As a result, the number of turns (n) in Equation (1) varies, making it impossible to fabricate the desired magnetic sensor device that satisfies the design specification and, in an extreme case, the product cannot even fulfil the function of an inductor device. It has thus been found that in winding a wire directly around a magnetic element servicing as the core of a magnetic sensor device, the relationship between the cross-sectional area of the magnetic element and that of the coil of wire to be directly wound around the magnetic element is also an important factor.

In practice, the wire could be easily wound around the magnetic element without impairing its own function when at least the following condition was satisfied: Sw/Sm≦9, where Sw is the cross-sectional area of the wire to be directly wound around the magnetic element and Sm is the cross-sectional area of the magnetic element. The cross-sectional area of the wire to be directly wound around the magnetic element covers all portions of the wire that extend to its maximum outer dimension, including the current-carrying conductive portion, the insulation layer and the fusing layer. The insulation layer is desirably thick enough to pass all relevant tests, such as an ordinary insulation breakdown voltage test. No structural problems which occur if the thickness of the insulation layer satisfies the range of Sw/Sm≦9. It should, however, be noted that if the insulation layer is excessively thick, the cross-sectional area of the conductive layer becomes very small, eventually increasing the electrical resistance of the sensor device, thereby resulting in a device that is infeasible in practice. Hence, it is necessary to adjust the thickness of the insulation layer to be appropriate for a specific use. If the magnetic sensor device is to be used in an application where an increased electrical resistance will present no problems, the thickness of the insulation layer may be increased. Alternatively, if the electrical resistance of the sensor device has to be reduced, the thickness of the insulation layer is also reduced. It should also be mentioned that if direct winding is practiced with a combination of the magnetic element and a wire that does not satisfy the condition Sw/Sm≦9, the magnetic element becomes a support of the wire that is directly wound around it, and a great force is imposed upon the magnetic element. The inventors found that this phenomenon introduces considerable difficulty in the winding operation.

The magnetic element to be used in the magnetic sensor device of the present invention may be made of any metallic material that has a permeability of at least 1,000 in an excitation field of 10 mOe at 10 kHz. As long as this condition is met, the alloy composition, shape, and crystal structure of the magnetic element (whether crystalline or amorphous) are not limited in any particular way. Amorphous metallic materials of high permeability are particularly suitable for use as the magnetic element in the present invention since they have sufficiently high strength to withstand direct winding. Amorphous metallic materials chiefly composed of Co, Fe, Si and B are particularly preferred for use as the magnetic element in the present invention since both filaments and ribbons having permeabilities of at least 10,000 in an excitation field of 10 mOe at 10 kHz can be easily prepared.

First Embodiment

Figure 2:
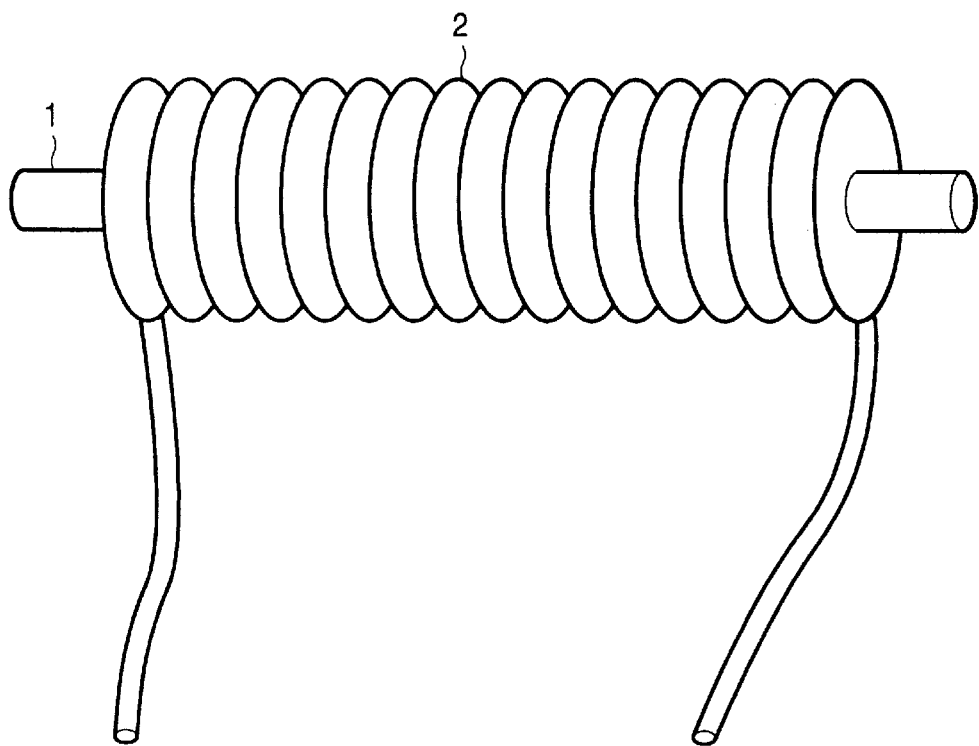
FIG. 2 is a perspective view of a magnetic sensor device according to a first embodiment of the present invention.
Figure 3:
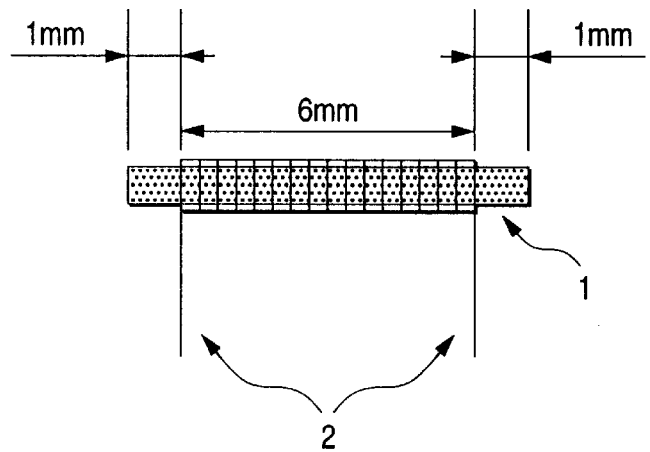
FIG. 3 is a diagrammatic front view of the magnetic sensor device of FIG. 2.

FIGS. 2 and 3 show an exemplary construction of a magnetic sensor device according to a first embodiment of the present invention. As shown clearly in FIG. 2, the magnetic sensor device consists of a magnetic wire 1 (i.e., magnetic element) and a coil 2 wound directly around the magnetic wire 1. As shown specifically in FIG. 3, the magnetic wire 1 is 8 mm long, and the coil 2 is wound around the central portion of the magnetic wire 1 and is 6 mm long.

An amorphous magnetic wire may typically be used as the magnetic wire 1 having a small cross-sectional area. Amorphous magnetic wires are currently being produced, and those having a cross-sectional area of not more than about 0.55 mm$^2$ are readily available. Such amorphous magnetic wires have outstanding mechanical properties. For example, their Vickers hardness is almost 900, which is far better than the 730 value exhibited by piano wires. The tensile strength is about 360 kg/mm$^2$, which is also far better than the value exhibited by piano wires (i.e., approximately 300 kg/mm$^2$). In addition, the amorphous magnetic wires have superior flexibility and corrosion resistance. The amorphous magnetic wire having these outstanding mechanical properties is suitable for use as the magnetic element that satisfies the two principal requirements of the present invention (i.e., a very small cross-sectional area and the applicability as a core around which a wire is to be directly wound).

The magnetic characteristics of the amorphous magnetic wire can be selected by adjusting its composition. Its magnetic characteristics can also be controlled by subjecting it to a heat treatment while under tension. For example, the saturation magnetostriction constant, which is an important factor for the purposes of the present invention, can be varied by adjusting the temperature of the heat treatment applied while the wire is under tension.

Table 1 compares the amorphous magnetic wire used in the first embodiment of the present invention with another wire to be described below in terms of alloy composition, wire diameter, the temperature during heat treatment and the saturation magnetostriction constant.

TABLE 1

Characteristics of Magnetic Elements

|  | Sample 1 | Sample 2 |
|---|---|---|
| Composition | $(Fe_{0.06}Co_{0.94})_{72.5}Si_{12.5}B_{15}$ | $Co_{72.5}Si_{12.5}B_{15}$ |
| Wire Diameter | 100 μm | 125 μm |
| Temperature During Heat Treatment | 490° C. | untreated |
| Saturation Magnetostriction Constant | $-0.1 \times 10^{-6}$ | $-3.0 \times 10^{-6}$ |

Figure 4:
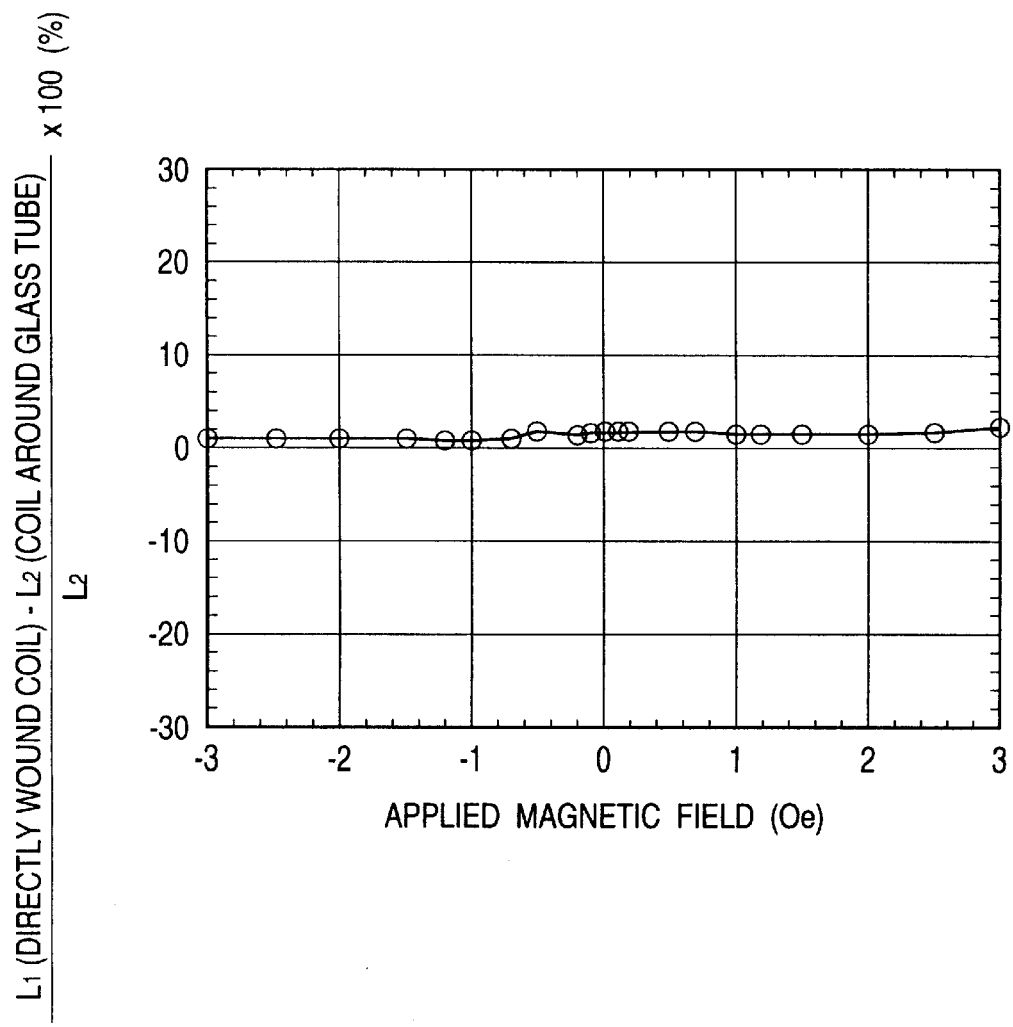
FIG. 4 is a graph comparing the changes in inductance upon application of an external magnetic field between two cases, one where a wire is directly wound around an amorphous magnetic wire having a magnetostriction constant whose absolute value is less than $1 \times 10^{-6}$, and the other case where the same amorphous magnetic wire is inserted into a glass tube around which a wire is wound.

Using sample 1 as the magnetic element, a magnetic sensor device of the configuration shown in FIGS. 2 and 3 was fabricated. An external magnetic field Hex was generated from a Helmholtz coil and applied to the sensor device in its longitudinal direction. The resulting change in inductance L was normalized by the change in inductance L as measured on a device that comprised a glass tube, a wire wound around the glass tube, and the amorphous magnetic wire of sample 1 that was inserted into the glass tube so that no winding stress would be exerted on the magnetic element (i.e., amorphous magnetic wire). The measurements were conducted at a frequency of 10 kHz using a sinusoidal excitation current of 1 mA. The results are shown in FIG. 4, from which one can see that there was no appreciable difference in inductance versus Hex characteristic between the directly wound magnetic sensor device and the device using a coil on the glass tube. It is therefore clear that if the absolute value of the saturation magnetostriction constant λs of the magnetic element is less than 1×10$^{-6}$, not only is the inductance in the absence of an external magnetic field insensitive to the direct winding of a coil, but so are the magnetic characteristics of the magnetic sensor device. In FIG. 4, the normalized change in inductance is not exactly zero percent due to the slight difference between the inside diameter of the directly wound coil and that of the coil on the glass tube. However, what is critical to the present invention is that the characteristic shown in FIG. 4 is constant in spite of a varying external magnetic field.

Figure 5:
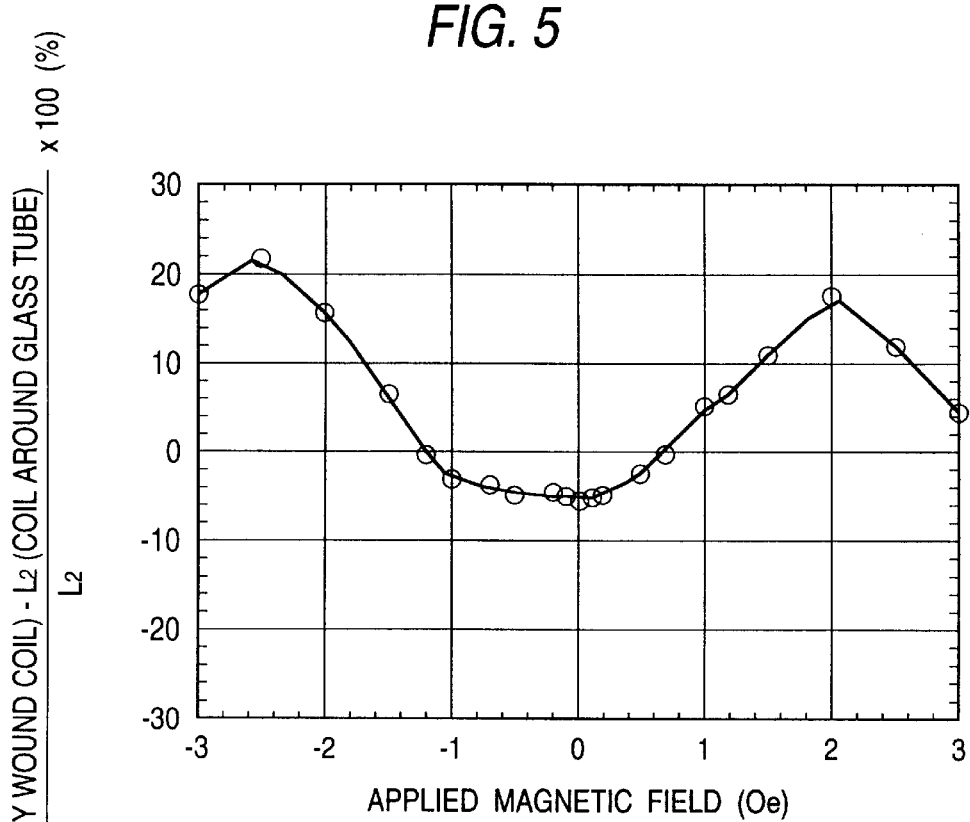
FIG. 5 is a graph comparing the changes in inductance upon application of an external magnetic field between two cases, one where a wire is directly wound around an amorphous magnetic wire having a magnetostriction constant whose absolute value is more than $1 \times 10^{-6}$, and the other case where the same amorphous magnetic wire is inserted into a glass tube around which a wire is wound.

Using sample 2 as the magnetic element, a magnetic sensor device of the configuration shown in FIGS. 2 and 3 was fabricated. An external magnetic field Hex was generated from a Helmholtz coil and applied to the sensor device in its longitudinal direction. The resulting change in inductance L was normalized by the change in inductance L as measured on a device that comprised a glass tube, a wire wound around the glass tube, and the amorphous magnetic wire of sample 2 that was inserted into the glass tube so that no winding stress would be exerted on the magnetic element (i.e., amorphous magnetic wire). The measurements were conducted at a frequency of 10 kHz using a sinusoidal excitation current of 1 mA. The results are shown in FIG. 5, from which one can see that there was an appreciable difference in inductance versus Hex characteristic between the directly wound magnetic sensor device and the device using a coil on the glass tube. It is therefore clear that the direct winding of a wire around the magnetic element having a saturation magnetostriction constant λs whose absolute value exceeds 1×10$^{-6}$ has a substantial effect on the value of inductance. Not only is the inductance in the absence of an external magnetic field affected, but so are the magnetic characteristics of the magnetic sensor device.

It can therefore be concluded that if the absolute value of the saturation magnetostriction constant λs of the magnetic element that serves as the core and around which a wire is to be directly wound is less than $1\times10^{-6}$, the magnetic characteristics of the core will not be affected by the direct winding of the wire. Ideally, the value of λs should be as close to zero as possible. If $|\lambda s|<1\times10^{-6}$, the effect of direct winding of the wire around the magnetic element can be sufficiently reduced. As shown in FIG. 4, the absolute value of λs is preferably less than $0.1\times10^{-6}$ in order to minimize the possible effect on the inductance of the magnetic sensor device.

Using the amorphous magnetic wire of sample 1 (100 μm) shown in Table 1, three specimens were fabricated by directly winding three copper wires having different maximum outside diameters, approximately 100 μm (of which 80 μm was occupied by the conductive portion), approximately 210 μm (of which 180 μm was occupied by the conductive portion) and approximately 310 μm (of which 270 μm was occupied by the conductive portion) around the respective specimens. The surface state of each specimen was examined with an optical microscope. In each of the specimens, the insulating layer had a smooth surface without any cracks, and performance as an inductor device was quite satisfactory. The copper wires had a modified polyester based coating which is commonly employed as a coating material on copper wires and is by no means special.

An additional experiment was conducted without satisfying the condition of Sw/Sm≦9, where Sw is the cross-sectional area of the wire to be wound around the magnetic element and Sm is the cross-sectional area of the magnetic element. That is, a copper wire having a maximum outside diameter of approximately 500 μm was directly wound around the amorphous magnetic wire of sample 1 (100 μm) shown in Table 1. Due to the large diameter of the copper wire, a large force was exerted on the amorphous magnetic wire at the bends due to the winding stress that the wire flexed. This force made it considerably difficult to continue the direct winding operation. Direct winding was possible only in limited areas where the copper wire had intimate contact with the magnetic element. The surface state of those areas of the coil was examined with an optical microscope. The insulation layer had a smooth surface and no cracks were found. However, it turned out that even when there was no insulation breakdown, it was mechanically difficult to perform an efficient winding operation unless the condition of Sw/Sm≦9 was satisfied.

Thus, it was found that in a magnetic sensor device that is basically composed of a wire directly wound around a magnetic element having a very small cross-sectional area not larger than 0.55 mm², the relationship between the cross-sectional area of the magnetic element serving as the core and that of the wire to be directly wound around the magnetic element is important. If at least the condition of Sw/Sm≦9 (Sw is the cross-sectional area of the wire to be wound around the magnetic element and Sm is the cross-sectional area of the magnetic element) is satisfied, one can easily produce a practically feasible magnetic sensor device without impairing the basic characteristics of the magnetic wire.

A copper wire of 80 μm (with a coating having an outer diameter up to 100 μm) was directly wound around each of the amorphous magnetic wires of samples 1 and 2 shown in Table 1. The copper wire was wound in such a way that a coil having 500 turns was formed over a length of 6 mm in 9 superposed layers. Whether sample 1 or 2 was used, a magnetic sensor device could be fabricated without deformation of the amorphous magnetic wire serving as the magnetic core. The stress-elongation characteristic of each sample of the amorphous magnetic wire was measured. Sample 1 had an elastic limit of approximately 3,400 MPa and experienced an elongation of 4.2% upon application of a stress equal to the elastic limit. Sample 2 had respective values of approximately 3,200 MPa and 2.3%.

Amorphous magnetic wires can be reduced in diameter by drawing them through a suitable device, such as a diamond die. Hence, the need for a magnetic sensor device having a very short length can be met by reducing the wires to a sufficiently small diameter that the wires will not develop a demagnetizing field. It should be noted here that, as is clear from the results of the measurements on samples 1 and 2, both the elastic limit and the elongation upon application of a stress equal to the elastic limit, are varied greatly upon mechanical working. Even such a case, the two samples satisfy not only the condition for the elastic limit (i.e., the magnetic element should have am in excess of 1,000 MPa), but also the condition for the elongation it experiences upon application of a stress equal to σm ($1.0\% < \epsilon < 5.0\%$). Thus, the desired magnetic sensor device can be easily fabricated.

A comparative device was fabricated by directly winding a copper wire around a Permalloy wire that was of the same shape as the amorphous magnetic wires and which had a high-permeability characteristic. However, the device was not functional as a magnetic sensor since the stress that was applied to the Permalloy wire in its circumferential direction caused deformation of its surface. The stress-elongation characteristic of the Permalloy wire was such that it had an elastic limit of approximately 100 MPa and experienced an elongation of approximately 0.2% upon application of a stress equal to the elastic limit. Thus, the copper wire around the Permalloy wire satisfied neither of the stated requirements for the elastic limit and the elongation upon application of a stress equal to the elastic limit.

Second Embodiment

The magnetic sensor devices fabricated in the foregoing embodiment were such that the magnetic element had a cross-sectional area of not more than 0.55 mm² and a saturation magnetostriction constant λs whose absolute value is smaller than $1\times10^{-6}$, with Sw/Sm being equal to or smaller than 9 provided that Sw is the cross-sectional area of the wire and Sm is the cross-sectional area of the magnetic element. By satisfying these conditions, one could fabricate small and highly sensitive devices that are suitable for use in diverse fields. There is, however, a demand for the development of a magnetic sensor device having better environmental resistance in a corrosive atmosphere, so as to be suitable for use in hostile environments (e.g., in automobiles).

If the magnetic sensor device is to be used in various fields as one of the passive elements of an electronic circuit, it is essential that the wire ends of the coil be properly connected to the circuit. However, the magnetic sensor devices in the foregoing embodiment involve complex steps for establishing connection to the circuit, such as the processing of the ends of the coil. It is therefore desired to develop a magnetic sensor device having a so-called "circuit mountable structure" that can be easily connected to an external circuit, such as a signal detecting circuit. A magnetic sensor device according to a second embodiment of the invention that satisfies this need will now be described.

The magnetic sensor device of interest comprises a magnetic element, a coil formed by a wire wound around the magnetic element, and a nonmagnetic insulator resin with which the coil and the magnetic element inserted into the coil are covered to form an integral unit. As in the foregoing embodiment, the magnetic element of the magnetic sensor device has a cross-sectional area of not more than 0.55 mm² and a saturation magnetostriction constant $\lambda s$ whose absolute value is smaller than $1 \times 10^{-6}$, with Sw/Sm being equal to or smaller than 9 provided that Sw is the cross-sectional area of the wire and Sm is the cross-sectional area of the magnetic element. As in the foregoing embodiment, the wire has an insulation coating layer and may optionally have a fusing layer on its outermost surface. The insulation coating layer may have various thicknesses as long as they are great enough to pass all relevant tests, such as an ordinary insulation breakdown voltage test. The heat resistance of the coating layer should withstand temperatures of 100° C. and above. The wire is typically made of copper or copper alloys, but metallic materials of any kind and any composition may be used as long as their conductivity is 5 to 100% of that of copper.

The nonmagnetic insulator resin may be selected from among various polymeric materials that are good electrical insulators, and various thermosetting and thermoplastic resins. Particularly preferred are injection moldable thermosetting resins that have a thermal deformation temperature of at least 120° C., measured in accordance with the ASTM standard (18.6 kg/cm$^2$), with a temperature of deflection under load (TDUL) of at least 150° C. being more desirable. These resins permit the application of commonly employed polymer molding techniques, such as injection molding and extrusion molding. In these molding techniques, the resin not only covers the wire and the magnetic element to form an integral unit, but also serves as a shell that determines the shape of the device to be finally obtained. The molding techniques also provide a very effective manufacturing process, since the resins can be provided with any shape by changing the mold design and other parameters. Examples of the resins that can be employed include polyallylate resins, polyethylens terephthalate resins, liquid-crystal polyester resins, polyamide resins, polyphenylene sulfide resins, polypropylene resins, polysulfone resins, polyetharimide resins, acrylonitrile-butadiene-styrene copolymer resins, epoxy resins, phenolic resins, silicone resins, fluoroplastics and polyamide resins. These resins may contain inorganic fibers and particles such as those of glass and oxides.

The minimum distance, as measured from the surface of the magnetic element or the surface of the wire around the element to the outermost surface of the resin coating (which minimal distance is hereinafter referred to as the "thickness" of the resin coating) is preferably 20 mm or less. If the thickness of the resin coating exceeds 20 mm, the temperature characteristic of the magnetic sensor device having the resin coating layer tends to become unstable. Further, in order to ensure ease in the molding and manufacture of the device, the thickness of the resin coating is more preferably 10 mm or less, and most preferably 2.5 mm or less.

The outermost surface of the resin coating is provided with terminals for outputting an electrical signal from the wire. The terminals may assume various shapes, such as a planar sheet or a pin. Considering the applicability of the magnetic sensor device as an inductor device in an electronic circuit, the terminals are desirably electrode terminals that are also compatible with surface mounting technology. A preferred example of this case is a pair of planar terminals, with the wire ends of the coil being joined in the interior of the resin coating to the terminals of a conductive metal so as to establish an ohmic contact. Examples of conductive metals that can be used include copper, aluminum and nickel, as well as alloys thereof.

Figure 6:
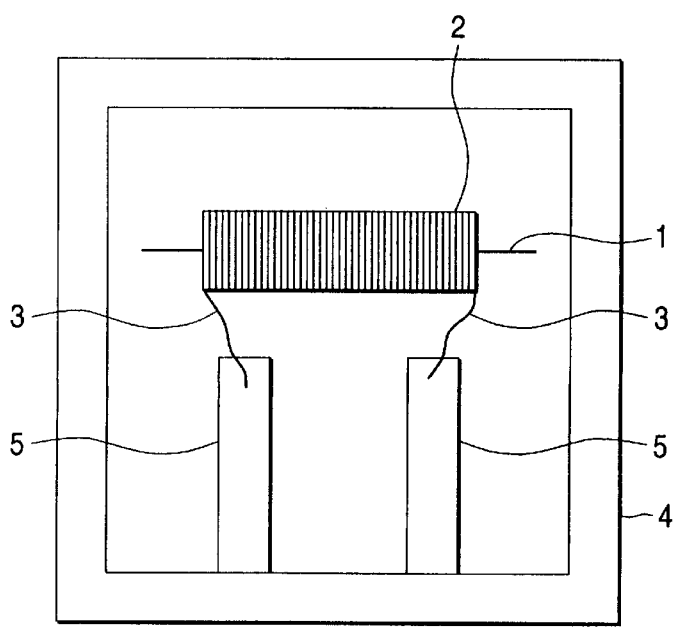
FIG. 6 is a diagrammatic plan view of an inductor device comprising a magnetic element and a wire wound around the magnetic element and joined to a leadframe.

FIG. 6 shows diagrammatically an inductor device according to the second embodiment of the present invention. The inductor device comprises a magnetic core (i.e., wire) 1 and a wire 2 that is wound around the core 1 to form a coil. The magnetic core 1 is an 8 mm long filament that has the composition $(Co_{0.94}Fe_{0.06})_{72.5}Si_{12.5}B_{15}$ (the subscripts indicating atomic percent). The filament was produced by cold drawing a rapidly cooled material into an amorphous magnetic wire of 100 $\mu$m and then annealing it at a temperature of 475° C. for 3 seconds. A 20-cm sample of the filament was found to have a permeability of 15,000 when measured in an excitation field of 10 mOe at a frequency of 10 kHz. The sample was also verified to have a saturation magnetostriction constant ($\lambda s$) of $-0.1 \times 10^{-6}$.

Figure 7:
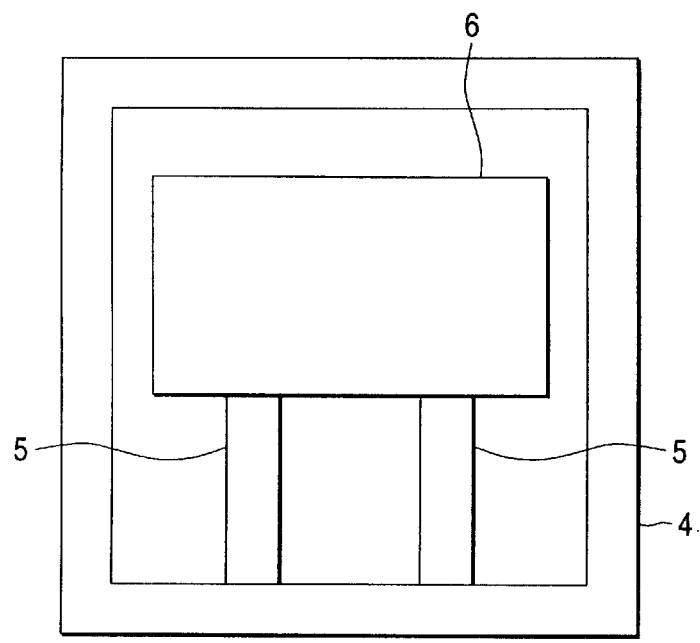
FIG. 7 is a plan view of a magnetic sensor device according to a second embodiment of the present invention in which resin coating is performed after injection molding.

The wire 2 had an outside diameter of approximately 100 $\mu$m (80 $\mu$m of which was occupied by the conductive portion), and was wound for 350 turns around the filament 1 to cover 6 mm of the central area. The surface layer of the wire 2 was made of a modified polyester based resin. The ends 3 of the coil (formed by the wire 2) were joined to a leadframe 4 at terminals 5, which were made of a highly conductive leadframe metallic material. The thus fabricated inductor device was covered with a resin layer 6 (see FIG. 7) that was injection molded through a die. The terminals 5 extend from the leadframe 4, which may typically be based on brass and plated with a solder layer on the underside to a thickness of 0.5 mm. The ends 3 of the wire 2 are joined to the terminals 5 by soldering. Thereafter, the magnetic core (i.e., wire) 1, the coil (made up of the wire 2) and the terminals 5 were entirely covered with the resin layer 6 as shown in FIG. 7, to thereby fabricate a magnetic sensor device.

In producing the magnetic sensor device according to the second embodiment of the present invention, various common winding, joining, resin molding and working techniques may be employed to the extent that enables the fabrication of the magnetic sensor device of the invention. In a typical fabrication process, the magnetic element 1 having the desired characteristics is provided as the core, around which the wire 2 is wound with a coil winder to form a coil of an inductor device. The ends of the wire 2 are then soldered to the conductive metal of which the terminals are made. Subsequently, the core, the coil and the terminals are covered with a resin layer by injection molding or some other technique to form an integral unit of a specified shape.

A specific procedure for covering the magnetic sensor device with the resin layer is as follows. The inductor device joined to the terminals on the leadframe 4 is placed in a specified area in a mold, using the leadframe 4 as a support. Molten resin is then injected into the mold cavity at about 300° C. A suitable molding resin is a liquid-crystal polyester resin (e.g., Rod Run LC5000 Series of UNITIKA, LTD.).

Figure 8:
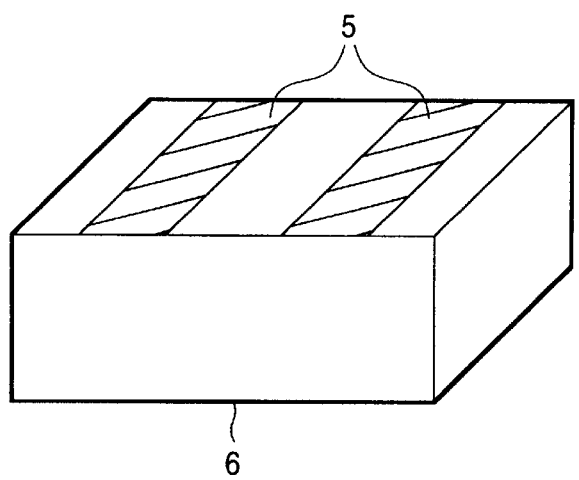
FIG. 8 is a perspective view of the magnetic sensor device according to the second embodiment, with the terminals (i.e., electrodes) being properly worked.

Using common resin molding technology, the device can be processed to any desired final shape, such as a rectangular prism or a cube, that allows the device to be easily mounted on an electronic circuit and other external circuits. In other words, the terminals extending from the device are optionally worked to a desired final shape. For example, after injection molding, the terminals may be bent back to fabricate a magnetic sensor device in a rectangular prism form (4 mm×5 mm×10 mm) having planar electrode terminals 5, as shown in FIG. 8. The thickness of the resin coating was measured in various parts of the device by profile examination with an optical microscope, and nowhere was the coating greater than 1.5 mm.

Figure 9:
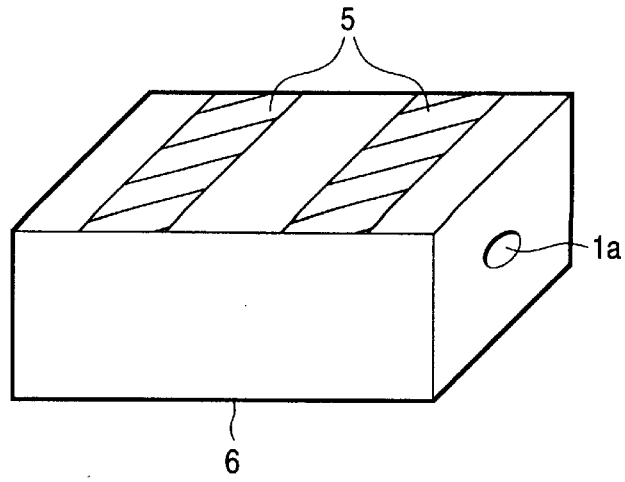
FIG. 9 is a diagrammatic perspective view of a magnetic sensor device with the magnetic wire being exposed in a cross section.

Even if an end face of the wire or the magnetic element is partially exposed, there will be no particular problem as long as the environmental resistance of the device is not adversely affected. For example, FIG. 9 shows one of the devices obtained by cutting a leadframe with which a multiple of devices were simultaneously produced. While the magnetic element 1 has an end face 1a exposed on one of its sides, this is not problematic since it does not affect the characteristics of the device.

Figure 10:
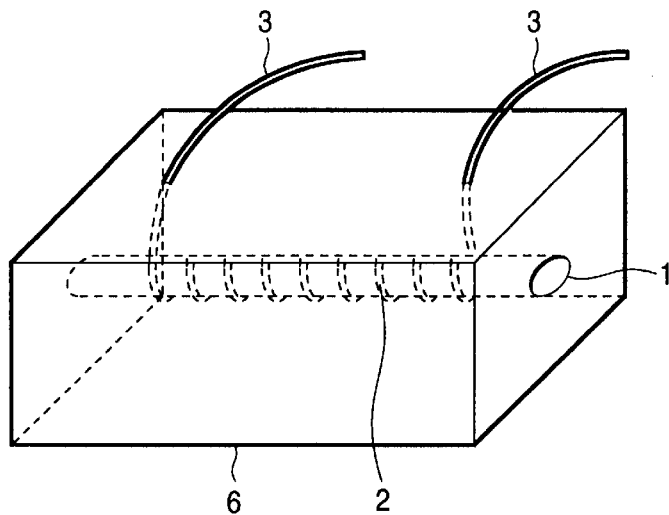
FIG. 10 is a perspective view of another magnetic sensor device according to the second embodiment of the present invention, with the terminals (i.e., electrodes) being properly worked.

If connection to an external circuit is to be established without employing surface mounting technology, the end portions of the wire may be pulled outside of the resin coating. Such a simple structure is satisfactory for those end portions to serve as terminals. An example of this simple design is shown in FIG. 10, where both ends 3 of the wire 2 are pulled to the outside of the resin layer 6 and used as terminals.

Figure 11:
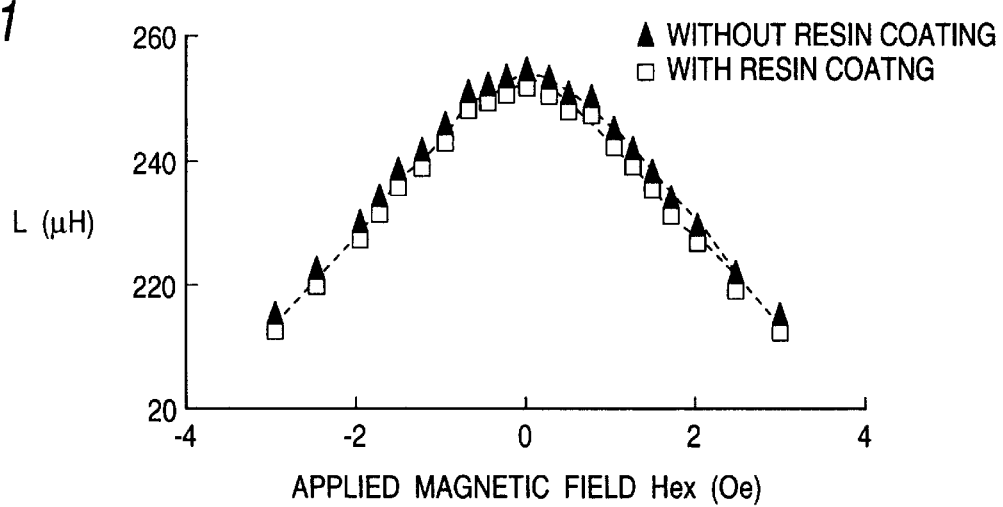
FIG. 11 is a graph exemplifying the dependency of the inductance of a magnetic sensor device upon an externally applied magnetic field.

The magnetic sensor device fabricated in the second embodiment was placed in a Helmholtz coil, and varying strengths of an external magnetic field Hex were applied in the longitudinal direction of the magnetic element. The resulting changes in the inductance value L of the device were measured at a frequency of 10 kHz using a sinusoidal excitation current of 1 mA at room temperature (i.e., 23° C.). The results are shown in FIG. 11 by open squares (□). As a control, a magnetic sensor device was fabricated from the same magnetic element and coil of wire, but without performing injection molding to provide a resin coating layer (i.e., the device was of the same configuration as that shown in FIG. 2). The change in the inductance value L of the control device was similarly measured at varying strengths of an external magnetic field. The results are shown in FIG. 11 by solid triangles (Δ). As FIG. 11 shows, both magnetic sensor devices exhibited a stable characteristic in detecting the magnetic field, indicating that the performance of the magnetic sensor device of the present invention is independent of the provision of a resin coating.

It should, however, be noted that the device according to the second embodiment of the invention could be easily connected to the detection circuit (on a substrate) within 30 seconds by using the terminals (in electrode form). On the other hand, the control device having no resin coating was not easy to handle, and took more than two minutes to be connected to a specified measurement substrate. Obviously, the magnetic sensor device according to the second embodiment of the invention, which has not only the resin coating but also the terminals for outputting an electrical signal from the wire, is easy to handle as a circuit component. In other words, the device can be easily connected to an external circuit, such as a detection circuit, so that the circuit is readily mountable as an electronic component. The magnetic sensor device according to the second embodiment of the invention, which has both the magnetic element and the wire covered with a resin to provide a monolithic molded article of a desired shape, permits efficient surface mounting with an automatic mounting machine. Thus, the sensor device of the second embodiment is a particularly preferred embodiment of the invention.

The environmental resistance of the magnetic sensor device according to the second embodiment of the present invention was measured in the following manner. Ten samples A to J of the magnetic sensor device were fabricated in a rectangular prism form (4 mm×5 mm×10 mm), as shown in FIG. 8. The samples were immersed in motor oil at 120° C. for 10 days, recovered from the oil, washed with alcohol, and had their magnetic characteristic (i.e., inductance) measured at room temperature (23° C.) by the method described above. The inductance was measured both before and after immersion in the motor oil under application of an external magnetic field which was either zero or 2 Oe. The results are shown in Table 2 below in terms of the percent change of a measured value (i.e., after immersion) from the initial value (i.e., before immersion). The percent change is determined by the following Equation (3):

Percent change=(measured value−initial value)×100/initial value(3)

As one can see from Table 2, all of the tested magnetic sensor devices experienced inductance changes of less than 0.1%, and thus could maintain a satisfactorily stable magnetism sensing function in a hostile environment.

TABLE 2

| Sample No. | Percent Change of Magnetic Characteristic of Magnetic Sensor | |
| --- | --- | --- |
| | In the Absence of an External Field | Under Application of an External Field of 2 Oe |
| A | +0.03 | −0.06 |
| B | +0.07 | +0.03 |
| C | −0.04 | −0.07 |
| D | −0.06 | +0.05 |
| E | +0.03 | −0.06 |
| F | −0.07 | +0.02 |
| G | +0.04 | −0.03 |
| H | −0.06 | −0.02 |
| I | +0.05 | +0.05 |
| J | −0.03 | −0.06 |

Third Embodiment

A magnetic sensor device according to a third embodiment of the present invention includes two resin layers covering both the magnetic element and the wire. The two resin layers result in a magnetic sensor having better heat resistance than those of embodiments 1 and 2, and having a greater thickness or complex shape. Specifically, a first resin layer serves as a stress buffer, and the first resin layer is covered with a thermoplastic or thermosetting second resin layer. The first resin layer serving as a stress buffer may be formed of various resins that exhibit rubber elasticity at room temperature; particularly preferred are silicone rubber based resins that hardly shrink upon curing and which corrode little on metals. The stress buffering resin layer should preferably have a thickness of at least 0.001 mm in order to attain the intended stress buffering effect, with a thickness of at least 0.01 mm being more preferred. The second resin layer covering the first resin layer may be formed of the various resins mentioned in the second embodiment of the invention. If both the magnetic element and the wire are to be covered with two resin layers, the stress buffering resin layer may be formed to a specified thickness by a suitable technique, such as coating before injection molding is applied to form the second resin layer.

Figure 12:
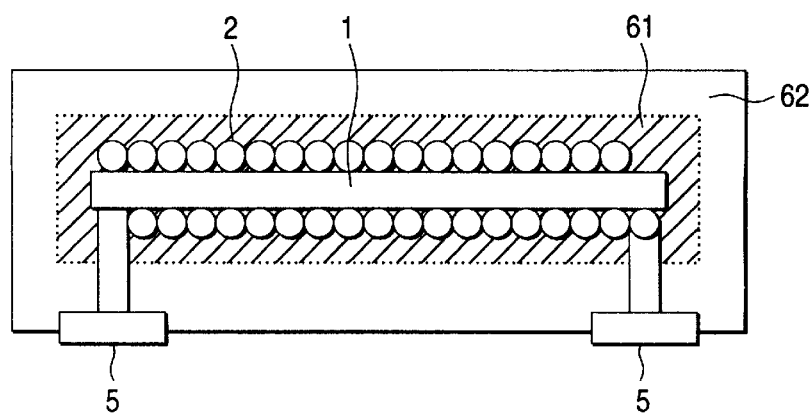
FIG. 12 is a diagrammatic cross section of a magnetic sensor device according to a third embodiment of the present invention.

FIG. 12 shows a magnetic sensor device according to the third embodiment of the present invention. A magnetic element 1 and a coil 2 (formed by winding a wire around the magnetic element 1) were both coated with a silicone rubber (KE3475 of Shi-Etsu Silicone Co., Ltd.). The coated magnetic element ad coil were then allowed to stand at room temperature for a day to form a stress buffering first resin layer 61 that was made of the silicone rubber and had a thickness of approximately 0.2 mm. The device was then subjected to injection molding under the same conditions as in the second embodiment, thereby forming a second resin layer 62. Thereafter, terminals 5 from the device were bent back to fabricate a magnetic sensor device in a rectangular prism form (7 mm×7 mm×10 mm). The total thickness of the first resin layer 61 and the second resin layer 62 was 3 mm at maximum.

To evaluate the temperature dependency of magnetic characteristics of the fabricated magnetic sensor device, its inductance was measured at varying temperatures. The result of the measurement was normalized by the inductance at room temperature. The magnetic characteristic (i.e., inductance) of the device was stable and remained substantially the same whether it was at an increased temperature of 125° C. or at room temperature.

While only certain embodiments of the invention have been specifically described herein, it will apparent that numerous modifications may be made thereto without departing from the spirit and scope of the invention.

What is claimed is:

1. A magnetic sensor device, comprising:

a magnetic element having a cross-sectional area of less than or equal to 0.55 mm$^2$ and a saturation magnetostriction constant $\lambda s$ of less than an absolute value of $1 \times 10^{-6}$; and a wire wound around said magnetic element;

wherein Sw/Sm is less than or equal to 9, Sw being a cross-sectional area of said wire and Sm being a cross-sectional area of said magnetic element.

2. The magnetic sensor device according to claim 1, further comprising a resin layer covering said magnetic element and said wire, thereby forming an integral unit.

3. The magnetic sensor device according to claim 2, wherein said resin layer comprises an elastomeric first resin layer covering said magnetic element and said wire, and a second resin layer covering said first resin layer.

4. The magnetic sensor device according to claim 1, wherein said magnetic element has an elastic limit greater than 1,000 MPa.

5. The magnetic sensor device according to claim 4, wherein an elongation said magnetic element experiences upon application of a stress equal to the elastic limit is between 1.0% and 5.0%.

* * * * *